United States Patent
Kanai

[11] Patent Number: 5,926,485
[45] Date of Patent: Jul. 20, 1999

[54] SEMICONDUCTOR TESTING DEVICE WITH REWRITE CONTROLLER

[75] Inventor: Junichi Kanai, Kazo, Japan

[73] Assignee: Advantest Corp., Tokyo, Japan

[21] Appl. No.: 08/894,105

[22] PCT Filed: Mar. 19, 1996

[86] PCT No.: PCT/JP96/00597

§ 371 Date: Jan. 20, 1998

§ 102(e) Date: Jan. 20, 1998

[87] PCT Pub. No.: WO97/34299

PCT Pub. Date: Sep. 18, 1997

[51] Int. Cl.[6] .................................................. G06F 11/00
[52] U.S. Cl. ............................................................. 371/21.1
[58] Field of Search ................................. 371/21.1, 21.2, 371/21.4, 21.6; 365/201, 184

[56] References Cited

U.S. PATENT DOCUMENTS 5,835,436  11/1998  Ooishi ..................... 365/222
5,844,849  12/1998  Furutani .................. 365/194

*Primary Examiner*—Vincent P. Canney
*Attorney, Agent, or Firm*—Muramatsu & Associates

[57] ABSTRACT

A semiconductor test system is capable of performing a simultaneous test for testing a plurality of memory devices at the same time as well as carrying out re-write operations in a page by page manner of the memory address, to reduce an overall test time. The semiconductor test system includes a hold means 5 which detects fail information in the output signal from a pass/fail judgement circuit 1, within a page of the memory address, and holds the fail information. A judgement means 11 is provided to determine, at the end of each page, whether the failure has occurred in each of the memory devices under test. A re-write control circuit 100 is provided for transmitting an output signal of the flip-flop 11 as a re-write prohibition signal 102. A plurality of re-write control circuits 200, 300 may be additionally provided corresponding to the number of devices to be tested.

6 Claims, 5 Drawing Sheets

SEMICONDUCTOR TESTING DEVICE WITH REWRITE CONTROLLER

TECHNICAL FIELD

This invention relates to a semiconductor test system having a simultaneous test function for testing a plurality of semiconductor memories that need repeated write cycles such as flash memories, and more particularly, to a semiconductor test system which is able to reduce the test time when writing the memories.

BACKGROUND ART

A semiconductor test system tests various types of semiconductor devices. One of the semiconductor devices is a flash EEPROM (Electrically Erasable Programmable Read Only Memory) that is a semiconductor IC memory. Further, in a semiconductor test system, in order to improve cost performance and test efficiency, a simultaneous test is frequently used in which a plurality of semiconductor devices are tested at the same time.

In a flash EEPROM, a time length (the number of times) required for writing data therein differs due to the structure of the memory cells. Thus, one writing process may not complete the data storage in a memory cell. In this type or memory, a write process of several cycles (re-write process) are usually necessary, and based on that re-write process, the memory is tested as to whether the memory device as a whole functions correctly or not. In other word, only a first write process will not necessarily be enough to evaluate the quality of the memory under test. Thus, after each of the write processes, the memory device is tested and if the device is determined acceptable, the test is continued for the remaining memory devices by repeatedly writing the data therein. The number of times for writing the data in the memory is predetermined based on the specification of the memory devices.

When testing a plurality of such re-write memory devices simultaneously by a semiconductor IC test system, the comparison result of each device is fed back to a control circuit for each channel corresponding to the device as a re-write inhibit signal so as to prevent excessive writing or erasing repetitions, which will improve reliability of the memory devices.

In the foregoing conventional technology, the memory devices are tested by performing the re-write process in an address by address manner to determine the pass/fail of the memory device.

In recent years, NAND type flash memories are newly introduced in the market as one of the flash memories. The NAND type flash memory can be re-written and evaluated as to pass/fail as a unit of page or byte. Therefore, the NAND type flash memory is distinguished from the conventional NOR type flash memory which is re-written address by address as a unit of bit.

FIG. 2 shows an example of semiconductor test system known to the inventor which has a simultaneous test function for testing a plurality of semiconductor memory devices that can be re-written. As shown in FIG. 2, the output signal of the memory device under test is applied to a pass/fail judgement circuit 1. A fail detection signal from the pass/fail judgement circuit 1 is selected by a selector 2 to match the corresponding channel of the test system based on the structural conditions of the memory device under test. For instance, the fail signal is selected and output according to the bit structure of input and output of the devices, such as 4 bit, 8 bit, . . . 18 bit and the like.

The fail signal is latched by a flip-flop 3 with a timing of a clock signal 101 for each address of the memory device. A logical AND is performed for the fail signal and a reference clock MCLK1 by an AND gate 4. A high level is fixedly provided at the data input terminal of a flip-flop 5. The flip-flop 5 is triggered by the output signal of the AND gate 4 to save this fail information. In an AND gate 6, the output signal of the flip-flop 5 passes therethrough when a write prohibition mode is activated. A selector 7 selects a channel for which the re-write operation should be prohibited. The timing is then adjusted by a clock signal MCLK2 by a flip-flop 8 and is output from a re-write control circuit 100 as a prohibition signal 102.

When the simultaneous test is carried out, the re-write prohibition signals of the number equal to the number of the devices under test are required. Therefore, in addition to the re-write control circuit 100, a re-write control circuit 200 for a channel 2 and a re-write control circuit 300 for a channel n are also provided.

FIG. 4 is a flow chart showing a control operation to carry out the re-write procedure for each address of the memory device. As shown in FIG. 4, an initial value (N=1) defining the first number of re-write procedure is set (step 502) after the start (step 501) of the operation. Then, the program command is set, and a program write process is performed (step 504) for the memory device under test. A verification command is set in the next step, and a verification process is performed (step 506) for the output of the memory device under test. During this process, when the verification result is not "pass", the re-write operation will be repeated (step 507). Unless the number of re-write operation exceeds the upper limit (for example, 10 times), the setting routine (step 508) is carried out for setting the program command in the step 503. When the upper limit is reached in the step 508, the memory device under test is regarded as defective, and the test process ends as a fail end (step 510).

When the verification result shows "pass" in the step 507, it is determined whether the test execution address is the last address of the memory device under test (step 509). If the last address of the memory device is not reached, the next address is tested (step 512) by returning to the step 502, and the foregoing operation is repeated. If the last address is reached at the step 509, the operation procedure ends as a pass end (step 511).

As described in the foregoing, a time effective memory test can be performed for a memory device which is re-written in a address by address basis. However, the following problems arise when testing a memory device that operates per each page such as a NAND type flash memory in using the above noted semiconductor test system.

In the semiconductor test system of FIGS. 3 and 4, it is determined as to whether the re-write operation should be performed based on the pass/fail result for each address of the memory device. Hence, at the timing of the end of each page of the memory address, the test results for the addresses within the page are not remained. In other words, re-write the control operation with respect to each page of the memory cannot be attained.

In addition, in the example of FIGS. 3 and 4 in which the re-write operation has to be carried out on the address by address basis, the overall time required for the test has to be longer than required in testing the memory device per page of the address.

The purpose of the present invention is to eliminate all of the drawbacks in the foregoing. It is an object of the present invention to provide a semiconductor test system which is capable of performing a simultaneous test for testing a plurality of memory devices at the same time as well as carrying out the re-write operation in a page by page manner of the memory address, and as a result, reducing the overall test time.

DISCLOSURE OF THE INVENTION

In the present invention, in a semiconductor test system having a pass/fail judgement circuit 1 for determining the pass/fail of the memory device under test when receiving the output signal from the memory device, it is provided with a hold means 5 which detects the fail information in the output signal from the judgement circuit 1, within a page of the memory address, and holds the fail information. A judgement means 11 is provided to determine, at the end of each page, whether the failure has occurred in each of the memory devices under test. A re-write control circuit 100 is provided for transmitting the output signal of the judgement means (a flip-flop) 11 as a re-write prohibition signal 102. The semiconductor test system of the present invention having the re-write control function is configured as described in the foregoing.

In addition, the semiconductor test system of the present invention may include a plurality of re-write control circuits (200, 300) similar to the re-write control circuit 100 as mentioned above corresponding to the number of memory devices to be tested.

In an operation flow of the re-write control, a program command is set so that a program write process is performed (step 504) for each page of address in the memory device under test. Next, a verification command is set in the operation flow so that the verification process is carried out (step 506).

Thereafter, as a next step, it is determined whether one page of address of the memory device is completed (step 60). If the one page is not completed, the process moves to the next address (step 602) and the program command routine (step 503) is carried out again. If the one page is completed in the step 601, judgement is made as to whether the overall verification results for the page is "pass" (step 507). If the verification results show that there is "fail", the re-write process is performed. Unless the upper limit of the number of re-write operations (for example, 10 times) is not exceeded, the routine of setting the program command of the step 503 will be repeated. If the upper limit is reached in the step 508, the memory device under test is regarded as defective and the process ends as a fail end (step 510).

As described above, the judgement as to whether the re-write process is to be performed is made as a unit of page of the memory address after writing data in all of the addresses in the page. If it is determined that the re-write process is necessary, such a re-write operation is collectively performed for the corresponding page. Hence, the overall test time can be considerably reduced compared to the previous example where the re-write operation is performed address by address.

BEST MODE FOR CARRYING OUT THE INVENTION

The embodiments of the present invention are explained with reference to the drawings.

Figure 1:
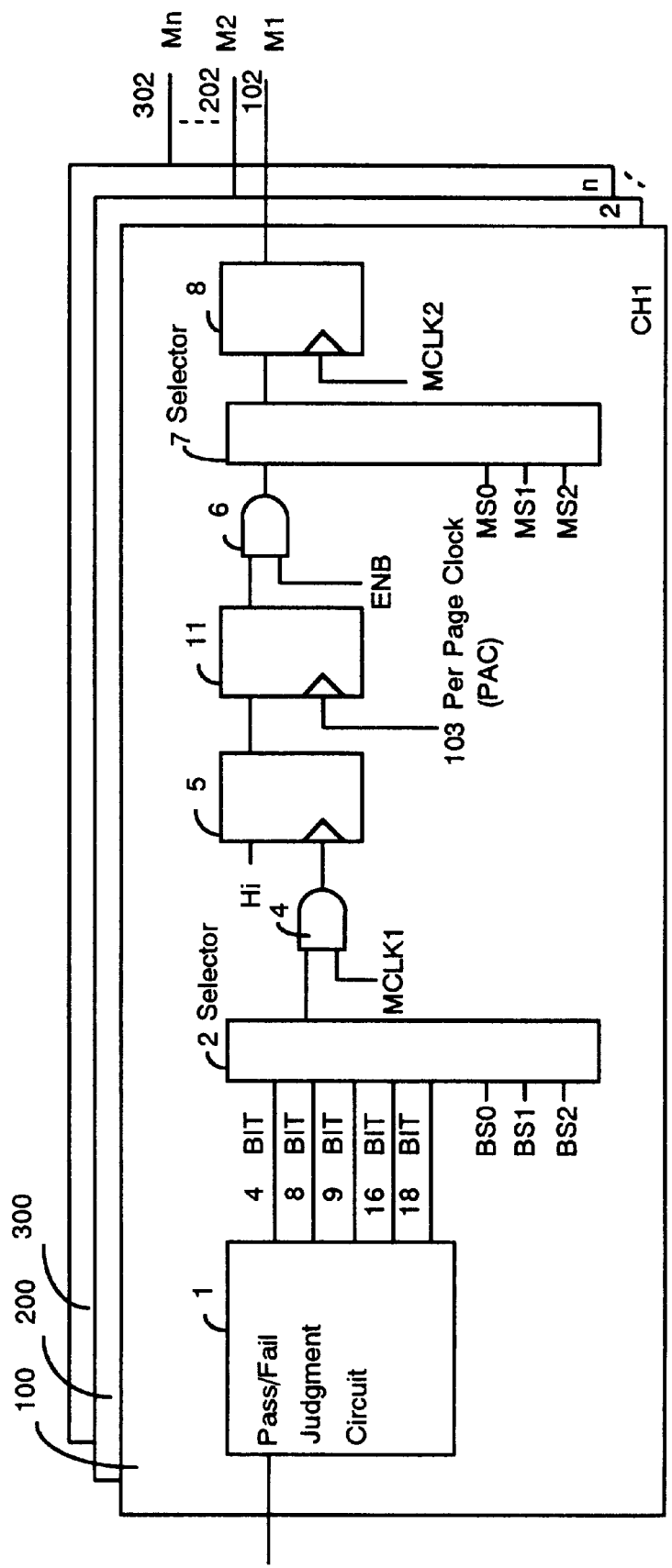
FIG. 1 shows a semiconductor test system having a re-write control circuit according to the first embodiment of the present invention.
Figure 2:
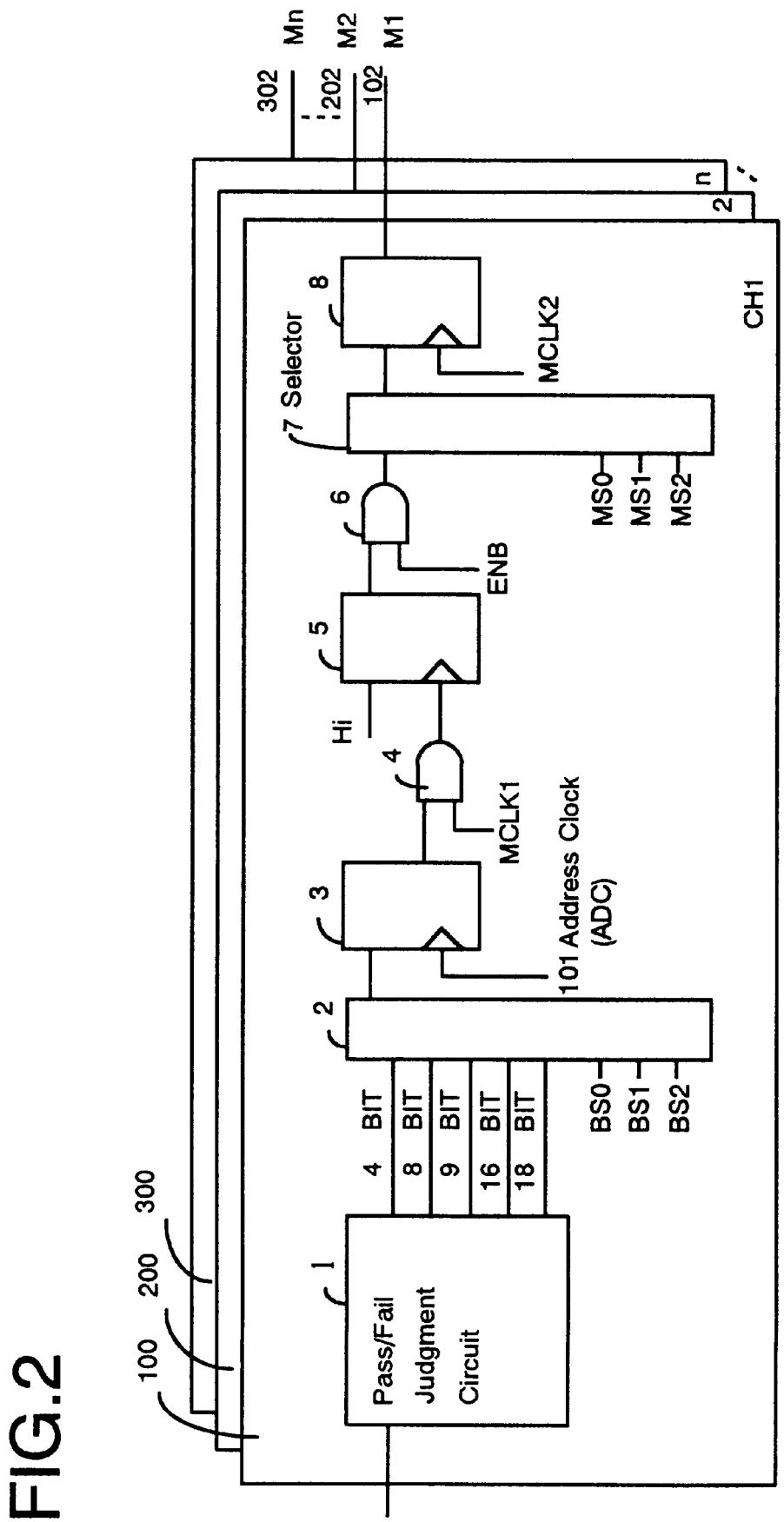
FIG. 2 shows a semiconductor test system having a simultaneous test function for testing a plurality of re-write semiconductor memories in the technology previously known to the inventor.

FIG. 1 shows the semiconductor test system of the first embodiment of the present invention having a re-write control circuit. A judgement circuit that determines pass/fail as a unit of page of the memory address is provided in a re-write prohibition control circuit to store fail information within each page. At the end of each page of the memory address, it is determined whether the "fail" has occurred in any of the memory devices under test. If the fail is detected, a re-write operation is performed.

As shown in FIG. 1, a pass/fail judgement signal of the memory device under test is applied to a clock input terminal of a flip-flop 5 whose data input terminal is provided with a fixed high-level signal. Then the output signal from this flip-flop 5 is applied to a data input terminal of a flip-flop 11 whose clock input terminal is provided with a page clock signal 103. Then, the output signal of the flip-flop 11 is transmitted to the memory device under test as a re-write prohibition signal 102. A plurality of re-write control circuits (200, 300) may be additionally provided corresponding to the plurality of test channels in the semiconductor test system.

Figure 3:
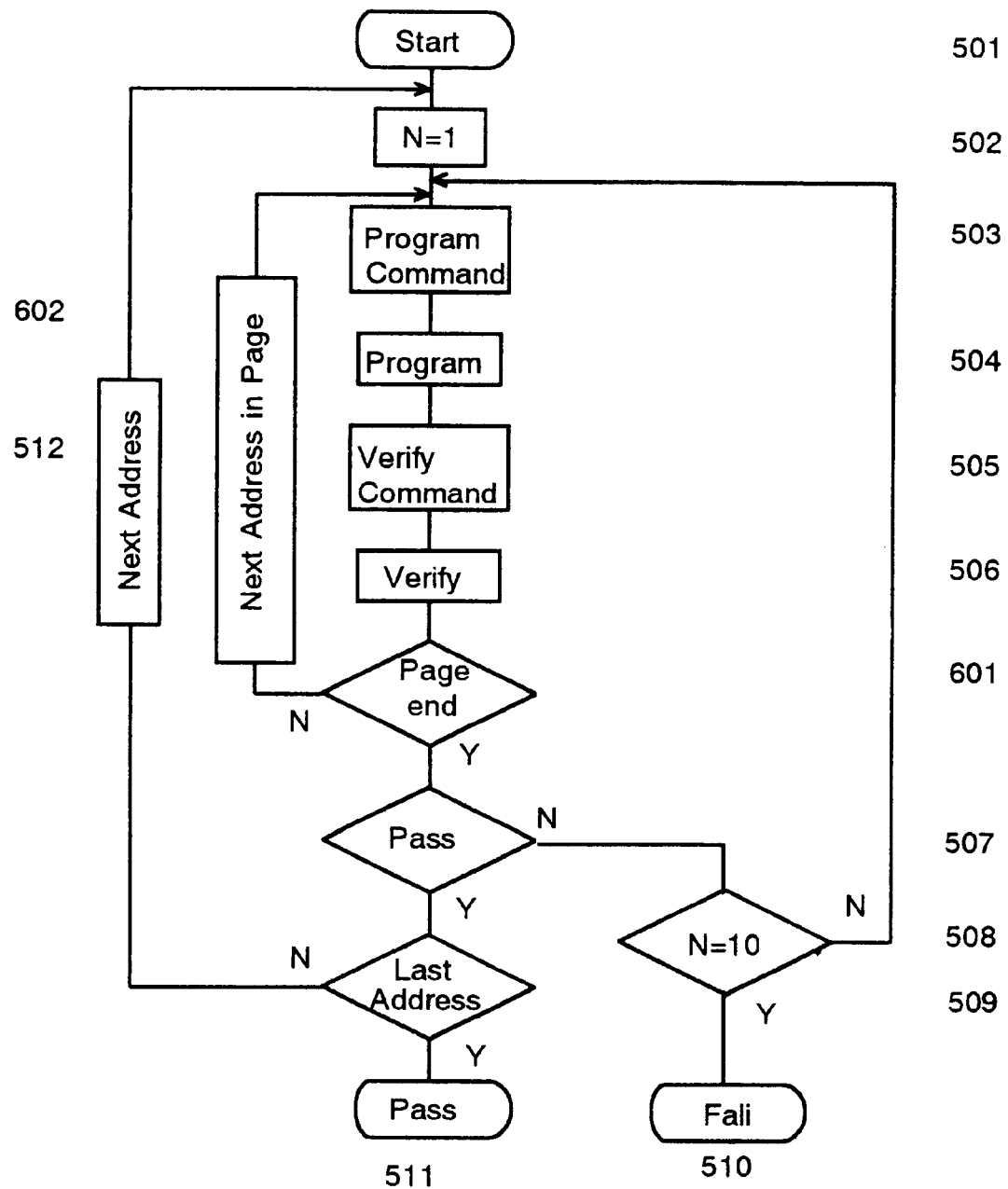
FIG. 3 is a flow chart showing a control operation of the re-write process for each page of the memory device.
Figure 4:
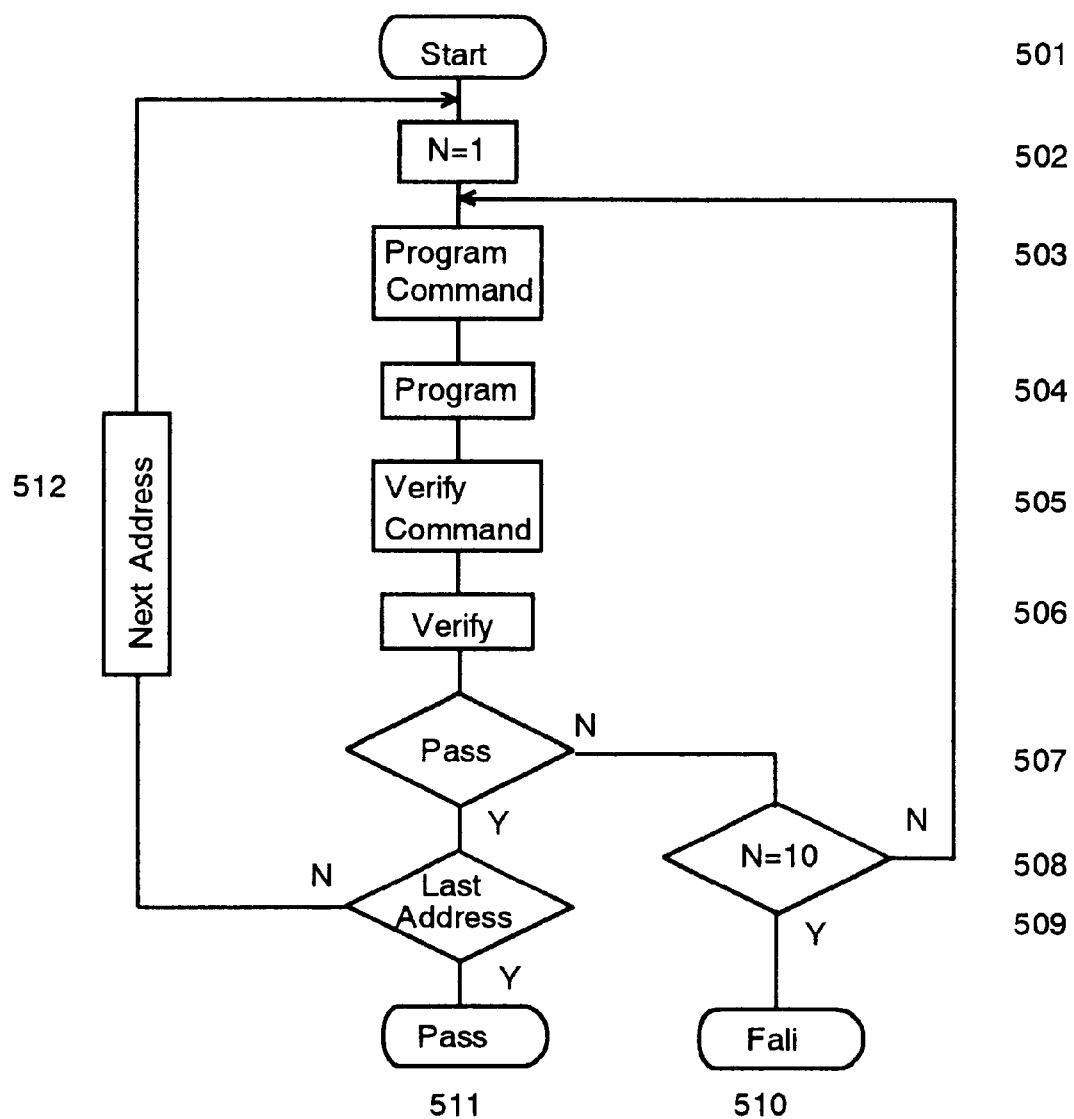
FIG. 4 is a flow chart showing a control operation of the re-write process for each address of the memory device.

FIG. 3 is a flow chart showing a control operation for performing the re-write process per page in the present invention. As shown in FIG. 3, an initial value (N=1) indicating the first number of re-write operation is set (step 502) after the start of the procedure (step 501). Then, a program command is set so that the program write process is carried out for the memory under test (step 504). A verification command is set in the next step, and a verification process is initiated (step 506).

In the next step, it is determined whether the verification has been completed for one whole page of the memory address (step 601). If the verification for the one whole page is not completed, the verification of the next address within the page is initiated (step 602), and the program routine (step 503) is repeated. When the one page is completed in the step 601, the process determines whether the verification result for the whole page indicates "pass" or "fail" (step 507). If it is "fail", the re-write operation is carried out for the memory under test. If the upper limit of the number of re-write operation (for example 10 times) is not exceeded, the program command routine is set again in the step 508. If the upper limit of the number of re-write operation is reached, the memory device under test is regarded as defective and the process ends (step 510).

If the verification result shows "pass" in the step 507, the process determines whether the test execution address is the last address of the memory under test (step 509). If the last address of the memory is not reached, the next address of the memory under test is initiated (step 512), and the process goes to the step 502 which is the routine after the start of the operation so that the above noted operation is repeated. When the last address of the memory is reached in the step 509, the operation ends (step 511).

As described above, the judgement as to whether the re-write operation should be performed is made after the completion of writing the program in all of the addresses in the specified page of the memory. When the re-write operation is necessary, such an operation is performed for every page of the memory address. Hence the overall test time can be significantly reduced compared with the previous technology wherein the re-write operation is performed in the address by address basis.

In the above embodiment, the clock signal 103 for each page is applied at the end of writing the program in each page of the memory address. However, the clock 103 is not necessarily limited to the end of every page. For instance, the clock signal can be applied after each completion of writing the program for each address. In such a case, the structure of the present invention can include the operation of the previously known technology where the re-write operation is made for each address.

In the first embodiment described above, the flip-flop 5 is provided as shown in FIG. 1 as a circuit for holding the fail information during the verification of all the addresses in one page of the memory device so that the pass/fail is judged as a unit of page of the memory address. The flip-flop 5 in FIG. 1 is provided with the pass/fail judgement signal of the memory device under test at its clock input terminal and the high level fixed signal at the other input terminal. However, the flip-flop 5 may be modified as shown in FIG. 5.

Figure 5:
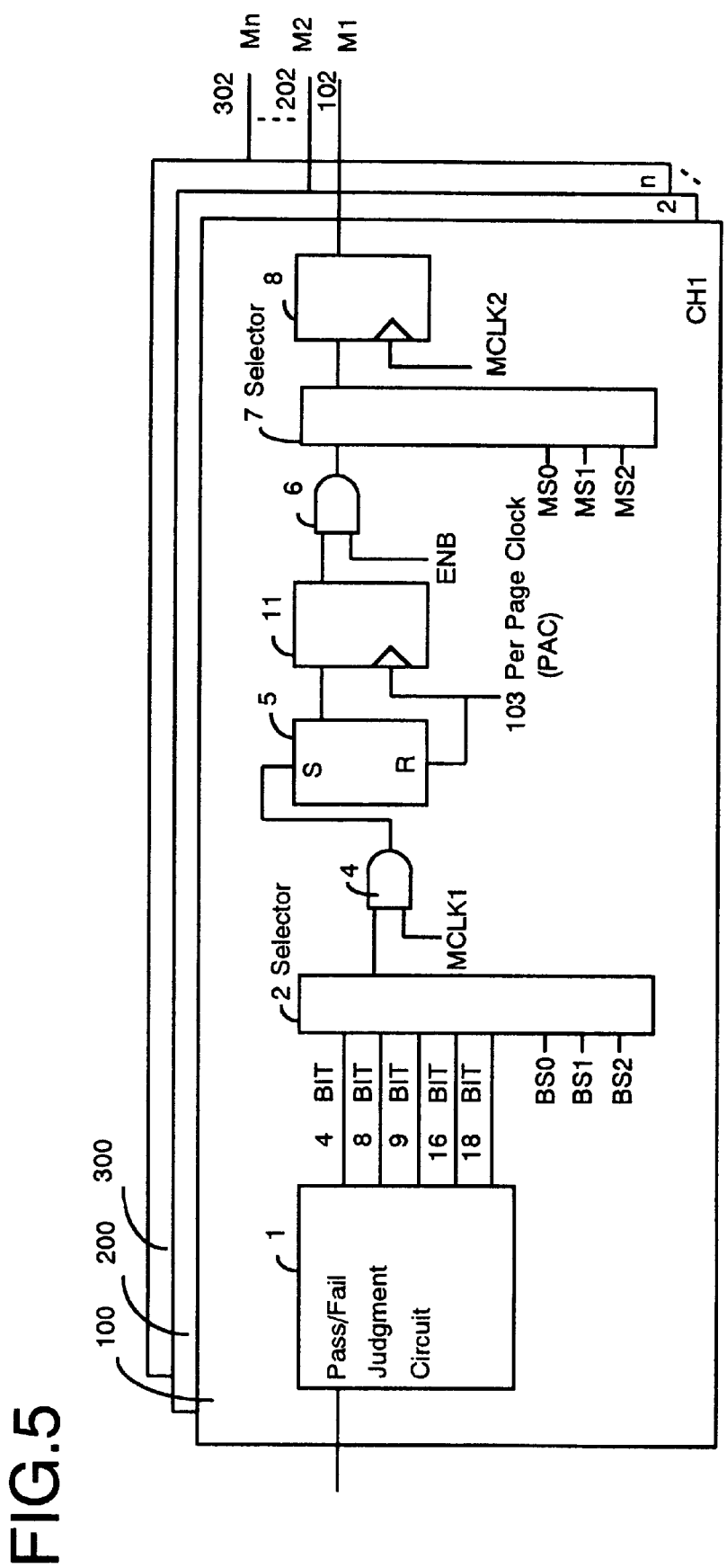
FIG. 5 shows a semiconductor test system having a re-write control circuit according to the second embodiment of the present invention.

FIG. 5 shows a semi-conductor test system having a re-write control circuit according to the second embodiment of the present invention. The pass/fail judgement signal for the memory device under test is supplied to a set terminal of a flip-flop 5 while the page clock signal 103 is applied to a reset terminal of the flip-flop 5. This modification also has the same effect as that of the first embodiment.

INDUSTRIAL APPLICABILITY

Since it is configured as described in the foregoing, the present invention has the following effects.

In testing a plurality of semiconductor memory devices having a re-write function such as a flash memory at the same time, in the present invention, the semiconductor test system having the re-write control circuit is capable of performing the re-write operation per page of the memory address. As a consequence, the test time required for such memory devices is significantly reduced.

What is claimed is:

1. A semiconductor test system having a pass/fail judgement circuit (1) for detecting failure in an output signal from a device under test characterized in having:

a hold means (5) for detecting fail information in a page of address of said device under test and holding said fail information (1);

a judgement means (11) for determining whether failure has occurred in said device under test at the end of each page of address; and a re-write control circuit (100) that transmits an output signal from said judgement means (11) as a re-write prohibition signal (102).

2. A semiconductor test system having a pass/fail judgement circuit (1) for detecting failure in an output signal from a device under test characterized in having:

a flip-flop (5) which is provided with an output signal from said pass/fail judgement circuit (1) at a clock input terminal and a fixed level signal at a data input terminal;

a flip-flop (11) which is provided with an output signal of said flip-flop (5) at a data input terminal and a per page clock signal (103) at a clock input terminal; and a re-write control circuit (100) that transmits an output signal from said flip-flop (11) as a re-write prohibition signal (102).

3. A semiconductor test system having a pass/fail judgement circuit (1) for detecting failure in an output signal from a device under test characterized in having:

a flip-flop (5) which is provided with an output signal from said pass/fail judgement circuit (1) at a set terminal and a per page clock signal (103) at a reset terminal;

a flip-flop (11) which is provided with an output signal of said flip-flop (5) at a data input terminal and a per page clock signal (103) at a clock input terminal; and a re-write control circuit (100) that transmits an output signal from said flip-flop (11) as a re-write prohibition signal (102).

4. A semiconductor test system having a re-write control circuit (100) as defined in claim 1, characterized in having:

a plurality of re-write control circuits (200, 300) corresponding to the number of devices to be tested.

5. A semiconductor test system having a re-write control circuit (100) as defined in claim 2 further includes:

a plurality of re-write control circuits (200, 300) corresponding to the number of devices to be tested.

6. A semiconductor test system having a re-write control circuit (100) as defined in claim 3 further includes:

a plurality of re-write control circuits (200, 300) corresponding to the number of devices to be tested.

\* \* \* \* \*